US011224212B2

(12) United States Patent
Wanninger et al.

(10) Patent No.: US 11,224,212 B2
(45) Date of Patent: Jan. 18, 2022

(54) ELECTRONIC RODENT TRAP WITH VOLTAGE BOOSTER CIRCUIT FOR IMPROVED TRAP PERFORMANCE OVER THE LIFE OF THE BATTERY

(71) Applicant: WOODSTREAM CORPORATION, Lititz, PA (US)

(72) Inventors: Daniel Wanninger, Springfield, PA (US); Kevin Murphy, Media, PA (US)

(73) Assignee: Woodstream Corporation, Lancaster, PA (US)

( * ) Notice: Subject to any disclaimer, the term of this patent is extended or adjusted under 35 U.S.C. 154(b) by 425 days.

(21) Appl. No.: 16/223,985

(22) Filed: Dec. 18, 2018

(65) Prior Publication Data
US 2019/0230915 A1 Aug. 1, 2019

Related U.S. Application Data

(60) Provisional application No. 62/610,374, filed on Dec. 26, 2017.

(51) Int. Cl.
*A01M 23/38* (2006.01)
*H02M 3/156* (2006.01)
*G11C 5/14* (2006.01)

(52) U.S. Cl.
CPC ............ *A01M 23/38* (2013.01); *G11C 5/145* (2013.01); *H02M 3/156* (2013.01)

(58) Field of Classification Search
CPC ...... A01M 19/00; A01M 23/12; A01M 23/38; A01M 31/00
USPC .......................................................... 43/98
See application file for complete search history.

(56) References Cited

U.S. PATENT DOCUMENTS

| 2,302,787 | A | * | 11/1942 | Meehan | A01M 23/38 43/98 |
| 2,420,723 | A | * | 5/1947 | Ratchford | A01M 23/38 43/98 |
| 2,595,130 | A | * | 4/1952 | Edwards | A01M 23/38 43/77 |
| 3,243,913 | A | * | 4/1966 | Carriero | A01M 1/04 43/98 |
| 3,388,497 | A | * | 6/1968 | Levine | A01M 23/38 43/98 |
| 3,468,054 | A | * | 9/1969 | Irvin | A01M 23/38 43/98 |

(Continued)

FOREIGN PATENT DOCUMENTS

WO    WO 03/059057    7/2003

OTHER PUBLICATIONS

International Preliminary Report issued is co-pending PCT Application PCT/US201/066261 dated Mar. 19, 2020, 11 pages.

(Continued)

*Primary Examiner* — Peter M Poon
*Assistant Examiner* — Morgan T Barlow
(74) *Attorney, Agent, or Firm* — Barley Snyder

(57) ABSTRACT

A circuit and method for boosting the voltage input to the gate of a MOSFET switch used in an electronic rodent trap is provided. By boosting the voltage to the gate, the MOSFET can be fully turned on to activate an effective killing cycle in the electronic rodent trap even when the trap's battery voltage has dropped to a level that would otherwise be insufficient to fully activate the MOSFET.

12 Claims, 1 Drawing Sheet

(56) References Cited

U.S. PATENT DOCUMENTS

| | | | | |
|---|---|---|---|---|
| 3,638,348 | A * | 2/1972 | Lusk | A01M 23/38 43/75 |
| 3,792,547 | A * | 2/1974 | Day | A01M 23/38 43/98 |
| 3,815,278 | A * | 6/1974 | Beaton | A01M 23/38 43/99 |
| 3,827,176 | A * | 8/1974 | Stirewalt | A01M 19/00 43/98 |
| 4,048,746 | A * | 9/1977 | Dye | A01M 19/00 43/98 |
| 4,074,456 | A * | 2/1978 | Tidwell | A01M 1/2011 43/112 |
| 4,205,480 | A * | 6/1980 | Gartner | A01M 23/38 43/98 |
| 4,497,130 | A * | 2/1985 | Fitzgerald | A01M 23/38 43/98 |
| 4,725,993 | A * | 2/1988 | Owen | A01M 29/18 331/111 |
| 4,780,985 | A * | 11/1988 | Coots | A01M 23/38 43/98 |
| 5,027,547 | A * | 7/1991 | Livshin | A01M 23/24 43/124 |
| 5,269,091 | A * | 12/1993 | Johnson | A01M 23/38 43/112 |
| 5,369,907 | A * | 12/1994 | Lee | A01M 23/38 43/69 |
| 5,406,742 | A * | 4/1995 | Allen | A01M 23/38 43/98 |
| 5,493,249 | A | 2/1996 | Manning | |
| 5,949,636 | A | 9/1999 | Johnson et al. | |
| 6,097,161 | A * | 8/2000 | Takano | H02M 3/073 307/110 |
| 6,609,328 | B2 | 8/2003 | Swift et al. | |
| 6,735,899 | B1 * | 5/2004 | Anderson | A01M 23/04 43/98 |
| 6,993,867 | B2 * | 2/2006 | Toyota | A01M 19/00 361/232 |
| 7,219,466 | B2 | 5/2007 | Rich et al. | |
| 8,024,888 | B2 * | 9/2011 | Wetzel | A01M 31/002 43/98 |
| 2003/0131522 | A1 * | 7/2003 | Swift | A01M 23/38 43/98 |
| 2005/0035809 | A1 * | 2/2005 | Finney | H03K 17/063 327/390 |
| 2006/0123693 | A1 * | 6/2006 | Muller | A01M 23/38 43/99 |
| 2008/0196295 | A1 * | 8/2008 | Oliver | A01M 19/00 43/98 |
| 2009/0102600 | A1 * | 4/2009 | Noe | A01M 31/002 340/3.1 |
| 2009/0128098 | A1 * | 5/2009 | Nakajima | H02M 3/07 320/139 |
| 2009/0223112 | A1 * | 9/2009 | Deibert | A01M 23/38 43/99 |
| 2012/0240450 | A1 * | 9/2012 | Bucher | A01M 23/14 43/98 |
| 2012/0285075 | A1 * | 11/2012 | Lubic | A01M 23/08 43/60 |
| 2013/0134957 | A1 * | 5/2013 | Hioka | G11C 16/0483 323/311 |
| 2013/0195291 | A1 * | 8/2013 | Josefsson | H02M 3/07 381/174 |
| 2014/0013649 | A1 * | 1/2014 | Rivera | A01M 23/38 43/99 |
| 2014/0167509 | A1 | 6/2014 | Fernald | |
| 2014/0373430 | A1 * | 12/2014 | Knudsen | A01M 23/38 43/98 |
| 2017/0104462 | A1 * | 4/2017 | Frith | H03F 3/185 |
| 2018/0004238 | A1 * | 1/2018 | Shen | H03K 19/017509 |
| 2019/0029246 | A1 * | 1/2019 | Kletzli | A01M 23/38 |

OTHER PUBLICATIONS

Extended European Search Report, Application No. 18895908.4-1004/ PCT/US2018/066261, dated Jul. 23, 2021, 8 pages.

* cited by examiner

ELECTRONIC RODENT TRAP WITH VOLTAGE BOOSTER CIRCUIT FOR IMPROVED TRAP PERFORMANCE OVER THE LIFE OF THE BATTERY

This application claims the priority of U.S. provisional application Ser. No. 62/610,371 filed Dec. 26, 2017.

BACKGROUND OF THE INVENTION

Field of the Invention

The present invention is related to the field of pest control and, more particularly, to a device and method for increasing the effective life span of batteries used in conjunction with electronic rodent traps.

Description of the Related Art

One defining characteristic of any battery powered device is the life of the battery. In connection with pest control, many electronic rodent traps rely on battery power to dispatch rodents and, to an increasing extent, to enable the trap for wireless communication. Both of these activities can be taxing on the battery, requiring the consumer to replace the batteries often.

With respect to the rodent dispatch function of an electronic rodent trap, many existing electronic rodent trap designs use a power N-channel metal-oxide-semiconductor field-effect-transistor (MOSFET) as a switch. Power N-channel MOSFETs are electronic devices typically possessing three pins including a gate, drain, and source pin. When a voltage is applied to the gate, current can then pass from the drain pin to the source pin. The power N-channel MOSFET switch generates a high voltage by rapidly switching the ground return path for a transformer on and off. The switching action creates a flyback voltage from the transformer on the order of thousands of volts, which is capable of killing a rodent.

The voltage applied at the gate must be sufficiently high to fully turn on the MOSFET. In existing electronic rodent trap designs, the voltage applied to the gate is typically provided by the battery, which is nominally 6V. For effective function, a minimum output voltage is required across the plates of an electronic trap to consistently shock both mice and rats. With a small drop in battery voltage, however, the MOSFET no longer fully turns on, and the flyback voltage from the transformer is significantly reduced.

Hence, a common problem in existing traps on the market is the inability to maintain this minimum voltage consistently over the life of the batteries. As the battery voltage drops, the efficacy of the trap will also drop. Therefore a need exists for a way to maintain the output voltage at a sufficiently high level to kill a rodent over a longer percentage of the total life of the batteries to increase the cost effectiveness of electronic rodent trap operation.

SUMMARY OF THE INVENTION

In view of the foregoing, the present invention is directed to a circuit and method for boosting the voltage input to the gate of a MOSFET switch used in a battery-powered electronic rodent trap. The circuit includes a multi-stage charge pump driven by a pulse train that is generated by a micro-controller. By boosting the voltage to the gate, the MOSFET can be fully turned on to activate an effective killing cycle in the electronic rodent trap even when the trap's battery voltage is low.

The present invention is also directed to an electronic rodent trap that includes a charge pump circuit to provide a higher voltage to the drive circuit that is used to generate the high voltage required for the trap to electrocute the rodent.

Accordingly, it is an object of the present invention to provide a voltage booster circuit for a battery-powered electronic rodent trap that maintains the efficacy of trap operation for the dispatching of rodents over a longer portion of the life of the batteries.

Another object of the present invention is to provide a battery-operated electronic rodent trap using a MOSFET switch that includes a multi-stage charge pump driven by a pulse train that is generated by a micro-controller, the multi-stage charge pump serving to boost the voltage to the gate of the MOSFET so that the MOSFET is fully turned on and the flyback voltage from the transformer is maintained even when the battery voltage has dropped.

A further object of the present invention is to provide a battery-operated electronic rodent trap that is more cost effective in operation, being configured to maintain the output voltage of the trap's electronic killing circuit at a sufficiently high level to kill a rodent over a longer percentage of the total life of the batteries.

These together with other objects and advantages which will become subsequently apparent reside in the details of construction and operation as more fully hereinafter described and claimed, reference being had to the accompanying drawings forming a part hereof, wherein like numerals refer to like parts throughout.

DETAILED DESCRIPTION OF THE PREFERRED EMBODIMENTS

Figure 1:
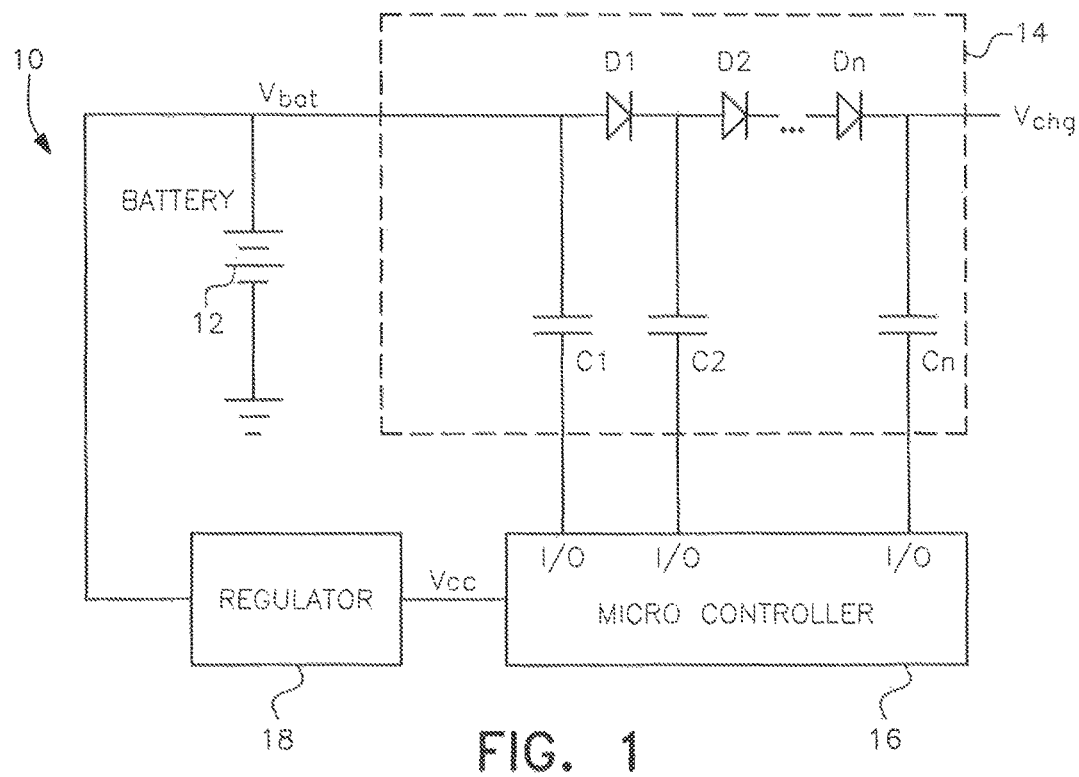
FIG. 1 is a block diagram of a circuit having a micro-controller-driven multi-stage charge pump for use with a battery-powered electronic rodent trap in accordance with the present invention.

It is to be understood that the embodiments described herein are disclosed by way of illustration only. It is not intended that the invention be limited in its scope to the details of construction and arrangement of components set forth in the following description or illustrated in the drawings. Also, in describing the preferred embodiments, specific terminology will be resorted to for the sake of clarity. It is to be understood that each specific term includes all technical equivalents which operate in a similar manner to accomplish a similar purpose.

As shown in FIG. 1, the present invention includes a circuit generally designated by reference numeral 10 for boosting the output voltage of a battery or batteries 12 within the circuit. The circuit 10 includes a multi-stage charge pump 14 that includes diodes D1, D2, Dn and capacitors C1, C2, Cn to generate an output voltage, Vchg, that is higher than the input voltage, Vbat, in a manner known in the art for charge pump circuits.

The charge pump 14 is driven by a pulse train that is generated by the input/output (I/O) pins of a micro-controller 16. The micro-controller 16 is, in turn, powered by a power supply, Vcc, which is derived from the battery or batteries 12 as regulated by regulator 18. The power supply, Vcc, to the micro-controller 16, may be identical to, or different from, the battery voltage, Vbat.

Each stage in the charge pump 14 is driven in turn to add the voltage supplied to the micro-controller 16 to the battery voltage so that, for n stages, the output of the charge pump, Vchg, is approximately equal to:

(battery voltage)+($n$*micro-controller voltage)

as shown in FIG. 1.

Figure 2:
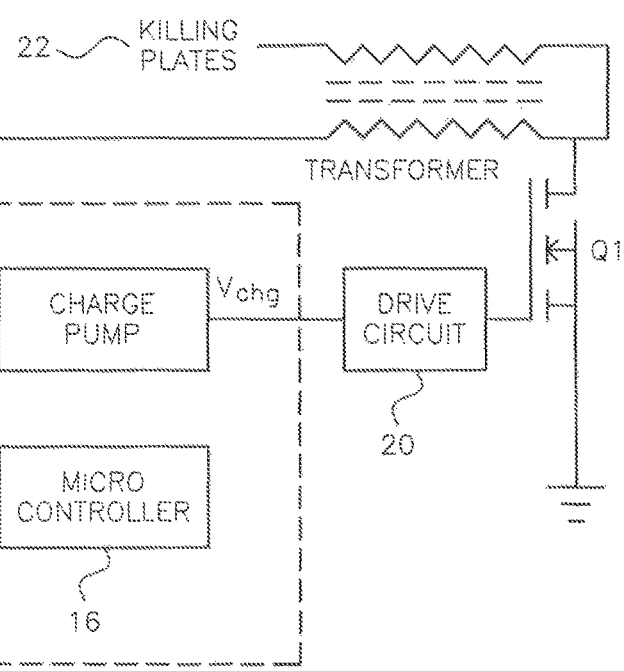
FIG. 2 is a block diagram of the components of a battery-powered electronic rodent trap that includes the circuit shown in FIG. 1.

As shown by the electronic rodent trap generally designated by reference numeral 100 in FIG. 2, the output of the multi-stage charge pump 14, Vchg, is connected to a drive circuit 20 and MOSFET Q1 used to generate the high voltage required to activate killing plates 22 used to electrocute the rodent.

According to one embodiment, the high-voltage MOSFET Q1 requires a gate voltage of approximately 5 volts to partially activate, and 10 volts to fully activate. Typical battery voltages used in electronic rodent traps like trap 100 are on the order of 6 volts with fresh batteries, with the voltage level decreasing as the batteries discharge. The charge pump circuit 14 as incorporated within the trap 100 according to the present invention allows the trap to generate a greater output voltage by more fully activating the power MOSFET Q1 when it has fresh batteries and to continue to activate the high-voltage MOSFET Q1, by boosting voltage to the gate thereof, even when the battery voltage as dropped to a level that would in itself be insufficient for trap activation and rodent dispatch. As a result, the flyback voltage from the transformer can be sustained even when the battery voltage itself is too low to fully switch on the MOSFET.

The foregoing descriptions and drawings should be considered as illustrative only of the principles of the invention. The invention may be configured in a variety of shapes and sizes and is not limited by the dimensions of the preferred embodiment. Numerous applications of the present invention will readily occur to those skilled in the art. Therefore, it is not desired to limit the invention to the specific examples disclosed or the exact construction and operation shown and described. Rather, all suitable modifications and equivalents may be resorted to, falling within the scope of the invention.

What is claimed is:

1. An electronic rodent trap for electrocuting rodents comprising:
    at least one battery;
    a micro-controller powered by said at least one battery;
    a circuit for boosting an output voltage of said at least one battery, said circuit including a multi-stage charge pump driven by a pulse train from said micro-controller and having outputs of each stage connected in series for generating an output having a voltage higher than said battery output voltage;
    killing plates coupled to a transformer for electrocuting a rodent when activated; and
    a drive circuit connected to the output of said circuit for boosting an output voltage of said at least one battery including said charge pump and to a high-voltage MOSFET coupled to the transformer, the MOSFET when turned on generating a high voltage by rapidly switching a ground return path of the transformer to create a flyback voltage that activates the killing plates, the higher voltage output of the charge pump fully activating the MOSFET even when the output voltage of the at least one battery has dropped to a level insufficient to fully turn on the MOSFET.

2. The electronic rodent trap as set forth in claim 1, wherein the charge pump includes a plurality of diodes and a plurality of capacitors configured in a plurality of stages, each stage being driven in turn to add a voltage supplied to the micro-controller to the battery output voltage.

3. The electronic rodent trap as set forth in claim 2, wherein the plurality of diodes are arranged in series.

4. The electronic rodent trap of claim 3, wherein the plurality of capacitors are arranged in parallel, each capacitor connected on a first end to a respective input/output pin of the micro-controller and connected on a second end between an output of one of the plurality of diodes and an input of another one of the plurality of diodes.

5. The electronic rodent trap as set forth in claim 1, wherein high-voltage MOSFET requires a gate voltage of approximately 5 volts to partially activate and 10 volts to fully activate.

6. The electronic rodent trap of claim 4, wherein the first end of each of the plurality of capacitors is directly connected to a respective input/output pin of the micro-controller and the second end of each of the plurality of capacitors is directly connected between an output of one of the plurality of diodes and an input of another one of the plurality of diodes.

7. The electronic rodent trap as set forth in claim 1, further comprising a voltage regulator arranged between the at least one battery and an input of the micro-controller for regulating a power supply voltage provided to the micro-controller.

8. The electronic rodent trap as set forth in claim 7, wherein the power supply voltage is different than the battery voltage.

9. A battery-operated electronic rodent trap having a transformer coupled to killing plates, the trap comprising a MOSFET switch coupled to the transformer and a multi-stage charge pump driven by a pulse train that is generated by a micro-controller, the multi-stage charge pump boosting a voltage input to a gate of the MOSFET so that the MOSFET is fully turned on and a flyback voltage from the transformer, used to activate the killing plates to electrocute a rodent, is maintained even when the battery voltage has dropped to a level insufficient to fully activate the MOSFET.

10. The battery-operated electronic rodent trap as set forth in claim 9, wherein outputs of each of a plurality of stages of the multi-state charge pump are connected in series to an input of a drive circuit for generating the voltage input to the gate of the MOSFET.

11. An electronic rodent trap, comprising:
    a battery;
    a micro-controller powered by the battery;
    a voltage regulator arranged between the battery and the micro-controller;
    a multi-stage charge pump having an input connected to the battery, including:
        a plurality of diodes arranged in series, a first diode of the plurality of diodes having an input connected to the battery; and
        a plurality of capacitors arranged in parallel, each capacitor of the plurality of capacitors being connected on a first end to a respective input/output terminal of the microcontroller and connected on a second end between an output of one of the plurality of diodes and an input of another one of the plurality of diodes, the charge pump driven by a pulse train from the micro-controller for generating an output having a voltage higher than the battery output voltage;
a drive circuit having an input connected to an output of a last one of the plurality of diodes of the charge pump;
a high voltage field-effect transistor connected between an output of the drive circuit and a transformer; and
killing plates coupled to the transformer for electrocuting a rodent when activated, the transistor rapidly switching a ground return path of the transformer to create a flyback voltage for activating the killing plates.

12. The electronic rodent trap of claim 11, wherein an output voltage of the multi-stage charge pump is approximately equal to:

$$(\text{battery voltage})+(n*\text{micro-controller voltage})$$

wherein n is the number of stages of the multi-stage charge pump, and the micro-controller voltage is the voltage supplied to the micro-controller by the voltage regulator.

* * * * *